United States Patent [19]

Howell

[11] Patent Number: 4,736,644

[45] Date of Patent: Apr. 12, 1988

[54] ADJUSTABLE GEAR SUPPORT BRACKET

[75] Inventor: Chesley R. Howell, Scarborough, Canada

[73] Assignee: Schlumberger Canada Limited, Toronto, Canada

[21] Appl. No.: 819,566

[22] Filed: Jan. 17, 1986

[51] Int. Cl.⁴ .............................................. F16H 35/06
[52] U.S. Cl. ........................................ 74/395; 74/411; 74/425
[58] Field of Search ................ 74/392, 395, 396, 406, 74/411, 425, 409; 403/53, 57, 187, 230; 248/178, 179, 221.3

[56] References Cited

U.S. PATENT DOCUMENTS

| | | | |
|---|---|---|---|
| 2,016,854 | 10/1935 | Cramer | 74/425 |
| 2,230,807 | 2/1941 | Lorentzen | 74/425 |
| 2,347,580 | 4/1944 | Stearns | 74/411 X |
| 2,348,391 | 5/1944 | Kester | 74/396 |
| 2,498,295 | 2/1950 | Peterson et al. | 74/411 |
| 3,004,445 | 10/1961 | Mondon | 74/411 |
| 3,199,363 | 8/1965 | Pickles | 74/425 |
| 3,821,907 | 7/1974 | Habert | 74/425 |
| 4,478,313 | 10/1984 | Wakase | 74/406 |

Primary Examiner—Randolph A. Reese
Assistant Examiner—Peter M. Cuomo
Attorney, Agent, or Firm—Dale Gaudier

[57] ABSTRACT

The tooth depth of a gear meshing with a worm wheel, such as used in an electricity meter register, is adjusted by providing a mounting plate for holding the shaft of the toothed gear having a limited range of motion for adjusting the distance of the gear from the worm. The toothed gear has one end of its shaft attached to a mounting plate having a J-shaped cutout provided along one edge. The shaft of the gear is mounted to the "hook" portion of the cutout. Movement of the J-shaped cutout in a direction within the plane of the mounting plate causes a corresponding change in the distance of the toothed gear from the worm, thus enabling the mesh depth between the gear and the worm to be easily adjusted. The arrangement has no moving parts and can be formed using a simple die-stamping process.

4 Claims, 1 Drawing Sheet

ADJUSTABLE GEAR SUPPORT BRACKET

BACKGROUND OF THE INVENTION

1. Field of the Invention

The invention relates to the field of gear supports and, more particularly, to an adjustable gear support bracket which is formed using a simple die-stamping process.

2. Description of the Prior Art

Many devices require a form of mounting or support for a toothed gear which is driven by a worm gear. For example, in an electricity meter, the shaft supporting the eddy disk has a worm gear formed thereon for meshing with a toothed gear. Motion of the eddy disk turns the shaft and worm gear, which then causes the toothed gear to turn. The toothed gear is linked to a mechanical register via a gear train for displaying the measured electrical power or energy. Since electrical energy or power must be accurately measured it is necessary that the worm gear and toothed gear mesh precisely and there is not too much free play or friction between them.

In conventional designs, one end of the shaft supporting the toothed gear is fixed while the other end is mounted to a plate which can slide in a direction toward or away from the worm gear. The sliding plate is attached to a bracket formed as part of the register support and is adjusted by a means of a slotted eccentric bolt or rivet mounted to the support bracket and engaging the slot of the gear support. Turning the eccentric bolt with a screwdriver causes the sliding plate and gear to be moved toward or away from the worm gear thus adjusting the mesh depth between the toothed gear and the worm gear. Once the proper depth has been set, a set screw, which rides in a slot on the sliding plate and is threadedly mounted to the bracket, is tightened.

It will be appreciated that the foregoing arrangement, and similar arrangements using set screws and separate supporting brackets, are complex and require a number of separate components to be assembled together and adjusted in order to properly set the desired mesh depth of the toothed gear with the worm gear.

SUMMARY OF THE INVENTION

The foregoing problems of prior art gear mounting arrangements are overcome by the present invention wherein there is provided an adjustable bracket for supporting the shaft of a gear or the like which is formed as a single, die-stamped unit. More particularly, the bracket comprises a flat piece of material having an opening formed therein for receiving a shaft of a gear and a generally J-shaped slot having two arm portions. One arm portion communicates with an edge of the flat piece of material and the shaft receiving opening is disposed within a portion of the flat piece of material bounded by the two arms defined by the slot. The distance of the shaft from the edge of the flat piece of material, and hence from the worm gear, is adjusted by moving the portion of the flat piece of material bounded by the arm portions within the plane defined by the flat piece of material so as to narrow or widen the arms of the slot.

Preferably, complementary notches are formed opposite each other in the flat piece of material at substantially the vertex of the J-shaped slot with the notches being sized to receive an adjustment tool, such as a screwdriver. By placing the tip of the screwdriver within the notches a clockwise or counterwise rotation of the screwdriver causes the portion of the flat piece of material supporting the gear shaft to move relative to the remainder of the flat piece of material.

Preferably, the bracket is formed by die-stamping from a flat piece of relatively rigid but ductile material, such as aluminum. The slot is formed having a width equal to or greater than the maximum amount of expected adjustment distance for the shaft.

With the foregoing arrangement, adjustment of the mesh depth of the toothed gear with a worm gear is performed simply by slightly bending the portion of the support bracket to which the shaft of the toothed gear is mounted in a direction lying within the plane of the support bracket. Thus, no moving parts, eccentric screws or set screws, which can loosen or go out of adjustment, are necessary.

BRIEF DESCRIPTION OF THE DRAWING FIGURES

These and other features and advantages of the present invention will be more clearly understood from the following detailed description of the preferred embodiment, when taken in conjunction with the accompanying drawing figures wherein.

DETAILED DESCRIPTION OF THE PREFERRED EMBODIMENT

Figure 1:
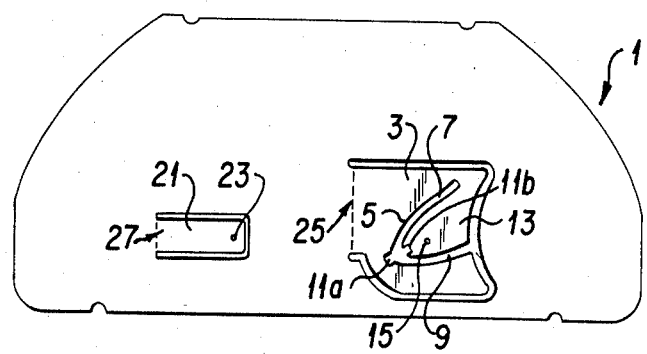
FIG. 1 is a plan view of a mounting plate showing the formation of the adjustable mounting bracket after initial die-stamping.

In FIG. 1 there is shown a mounting plate 1 which is formed from a relatively rigid, but ductile material, such as aluminum. Mounting plate 1 may, for example, be the plate used for mounting part of the gearing mechanism (not shown) used in an electricity meter register.

Mounting plate 1 includes an adjustable bracket 3 formed by die-stamping of the material of the mounting plate. Adjustable bracket 3 includes a generally J-shaped slot 5 formed therein having a first arm portion 7 and a second arm portion 9. Arm portion 9 communicates with an outer edge of the body of material forming the adjustable bracket. Slot 5 further includes a pair of complementary notches 11a and 11b formed opposite each other at the vertex of the J-shaped slot.

Arms 7 and 9 of slot 5 define a portion 13 of bracket 3. Portion 13 lies between arms 7 and 9 and includes an opening 15 for receiving one end of a shaft 17 which supports a toothed gear 19, as shown in FIG. 2.

Figure 2:
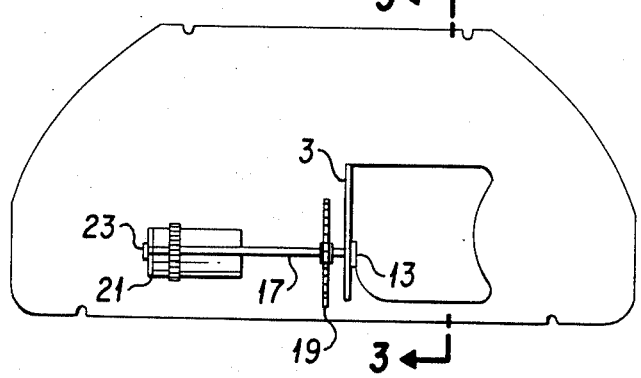
FIG. 2 is similar to FIG. 1 showing how a toothed gear and its associated shaft are mounted to the adjustable mounting bracket.

Also, as shown in FIGS. 1 and 2, mounting plate 1 includes a further auxiliary bracket 21 for supporting the other end of gear shaft 17. Auxiliary bracket 21 is formed by die-stamping of the material of mounting plate 1 and includes an opening 23 for receiving the opposite end of the gear shaft.

After die-stamping, brackets 3 and 21 are bent along dashed portions 25 and 27, as shown in FIG. 1, so that adjustable bracket 3 and auxiliary bracket 21 are disposed substantially at right angles to the plane of mounting plate 1, as shown in FIG. 2. One end of shaft 17 is placed within opening 15 of adjustable bracket 3 while the other end of shaft 17 is placed within opening 23 of auxiliary bracket 21.

Figure 3:
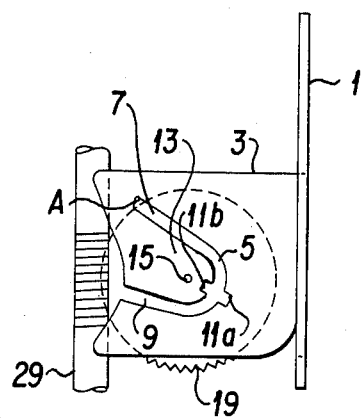
FIG. 3 is a side view of the arrangement shown in FIG. 2 taken along lines 3—3 showing in detail the adjustable mounting bracket and its associated toothed gear and worm gear.

As shown in FIG. 3, a worm gear and its associated shaft 29 are then brought into meshing contact with the teeth of toothed gear 19. Although the support for worm gear 29 is not shown, it is understood that this support is arranged such that the ends of worm gear 29 are fixed with relationship to mounting plate 1.

In order to adjust the degree of mesh between toothed gear 19 and worm gear 29 an adjustment tool, such as a screwdriver, is placed into engagement with notches 11a and 11b. By turning the adjustment tool clockwise or counter-clockwise portion 13 of bracket 3 is slightly bent at point A and the mesh depth of the teeth of gear 19 with worm gear 29 is thereby adjusted. It should be noted that movement of portion 13 will be within the plane defined by bracket 3. Hence, shaft 17 mounted within opening 15 will move in a direction substantially parallel to the movement of portion 13. Slot 5 is formed having a width equal to or greater than the maximum amount of expected adjustment distance for the mesh depth between toothed gear 19 and worm gear 29.

Since adjustable bracket 3 is formed from a rigid, yet ductile material, the mesh depth may be adjusted many times before fatigue or cracking occurs at point A of slot 5.

It will be appreciated that with the foregoing arrangement, an adjustable mounting bracket for a toothed gear can be formed using a simple die-stamping operation. The resulting adjustable bracket has no moving parts yet can be easily and quickly adjusted for a desired degree of mesh between the toothed gear and its associated worm gear.

While the foregoing invention has been described in considerable detail, it will be appreciated that various improvements and modifications will occur to those skilled in the art. Accordingly, the foregoing is intended to be descriptive, but not limitive, of the invention which is defined in the appended claims.

What is claimed is:

1. An adjustable bracket for supporting a shaft comprising:
    a substantially planar member having an outer edge and an opening formed in the planar member;
    a generally J-shaped slot formed in the planar member, the slot having two arm portions with one arm portion communicating with the outer edge of the planar member and wherein the opening is disposed within a portion of the planar member bounded by the two arm portions defined by the slot;
    a shaft having one end mounted in said opening and its opposite end mounted at a fixed distance from the bracket;
    a toothed gear mounted to the shaft; and
    a worm gear having threads meshing with the toothed gear, wherein
        the bracket and worm gear are at a fixed distance from each other, except for that portion of the planar member to which the shaft is mounted;
    whereby the distance of the shaft from said edge of the planar member is adjustable by moving the portion of the planar member bounded by the arm portions within the plane of the planar member so as to change the width of the arm portions of the slot by a desired amount.

2. The bracket of claim 1 wherein complementary notches are formed opposite each other in the planar member at substantially a vertex of the J-shaped slot, said notches being sized to received an adjustment tool such as a screwdriver.

3. The bracket of claim 1 wherein the planar member is formed from a relatively rigid but ductile material.

4. The bracket of claim 1 wherein the slot has a width at least as great as the maximum amount of desired adjustment distance for the shaft.

* * * * *